US008551277B2

(12) United States Patent
Ooyabu et al.

(10) Patent No.: US 8,551,277 B2
(45) Date of Patent: Oct. 8, 2013

(54) METHOD FOR PRODUCING LIGHT EMITTING DIODE DEVICE

(75) Inventors: Yasunari Ooyabu, Osaka (JP);
Hiroyuki Katayama, Osaka (JP);
Daisuke Tsukahara, Osaka (JP);
Munehisa Mitani, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/597,341

(22) Filed: Aug. 29, 2012

(65) Prior Publication Data
US 2013/0048209 A1    Feb. 28, 2013

(30) Foreign Application Priority Data

Aug. 30, 2011    (JP) .................................. 2011-186953

(51) Int. Cl.
*H01L 33/00*    (2010.01)
(52) U.S. Cl.
USPC ........... 156/248; 156/257; 156/249; 156/268; 156/247; 156/269; 156/298; 156/701; 156/714; 156/719; 257/100
(58) Field of Classification Search
USPC ......... 156/257, 230, 231, 234, 247, 269, 298, 156/701, 719; 257/100
See application file for complete search history.

(56) References Cited

U.S. PATENT DOCUMENTS

| 7,638,013 | B2* | 12/2009 | Hiller et al. ................... 156/249 |
| 7,951,623 | B2* | 5/2011 | Harada et al. ................... 438/27 |
| 2009/0218591 | A1* | 9/2009 | Grolier et al. ................. 257/100 |
| 2011/0005662 | A1* | 1/2011 | Sung ............................. 156/153 |
| 2012/0012246 | A1* | 1/2012 | Chen et al. .................... 156/247 |
| 2012/0024469 | A1* | 2/2012 | Takamoto et al. ............ 156/249 |

FOREIGN PATENT DOCUMENTS

| JP | 05-283456 A | 10/1993 |
| JP | 2010-123802 A | 6/2010 |

* cited by examiner

*Primary Examiner* — Katarzyna Wyrozebski Lee
*Assistant Examiner* — Margaret Squalls
(74) *Attorney, Agent, or Firm* — Sughrue Mion, PLLC

(57) ABSTRACT

A method for producing a light emitting diode device includes the steps of preparing a laminate including, in order, a supporting layer, a constraining layer and an encapsulating resin layer, each formed in a thickness direction; cutting the encapsulating resin layer and the constraining layer in the laminate into a pattern corresponding to the light emitting diode element; removing a portion which does not correspond to the light emitting diode element in the encapsulating resin layer and the constraining layer that are cut into the pattern; allowing the encapsulating resin layer corresponding to the light emitting diode element to be opposed to the light emitting diode element to be pressed in the direction where they come close to each other so as to encapsulate the light emitting diode element by the encapsulating resin layer; and removing the supporting layer and the constraining layer from the laminate.

3 Claims, 9 Drawing Sheets

1

FIG.3
(a)
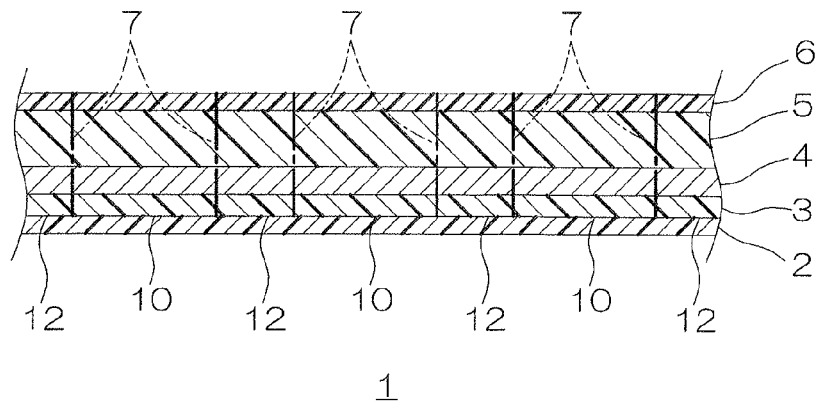
(b)
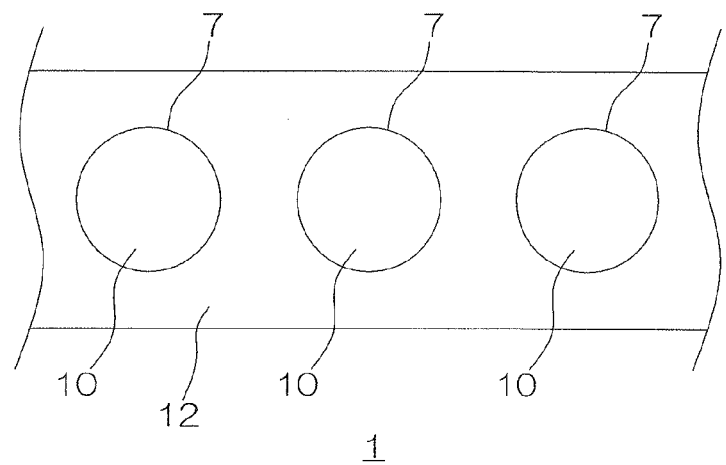

FIG.6
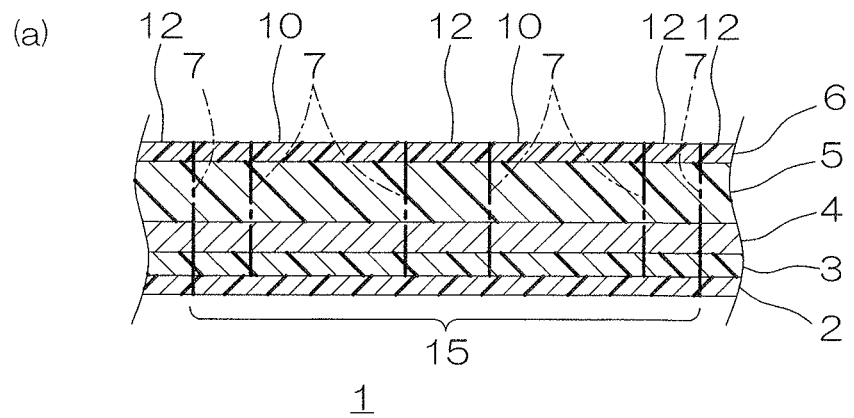
(a)
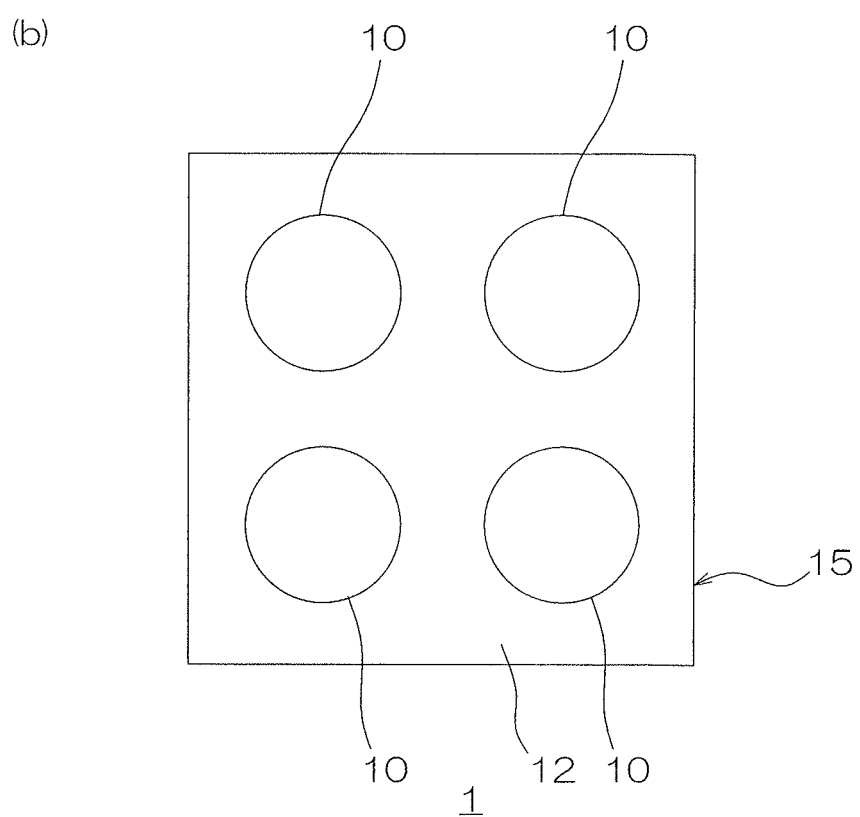
(b)

FIG.7 (a)
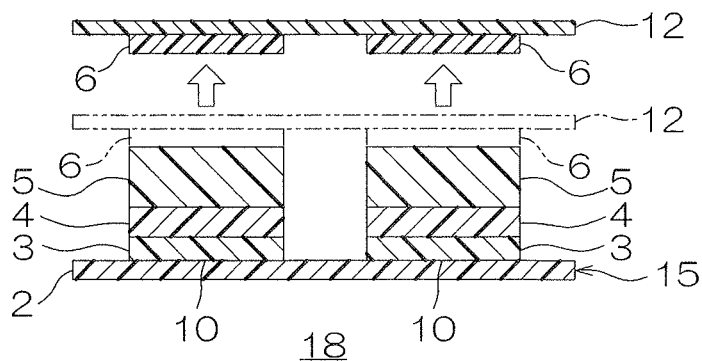
(b)
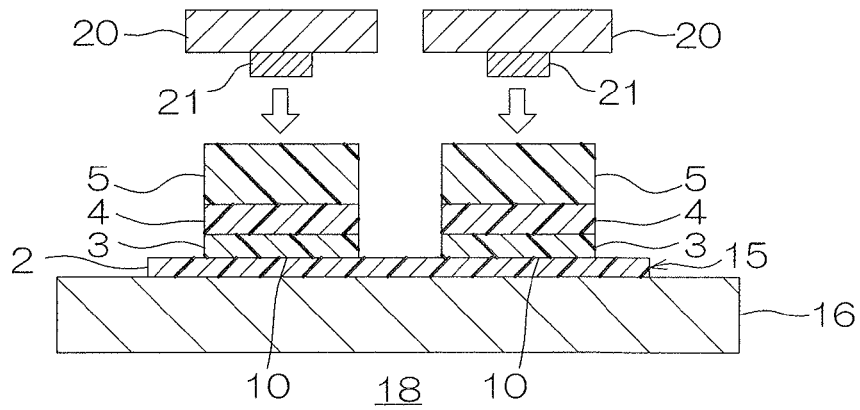
(c)
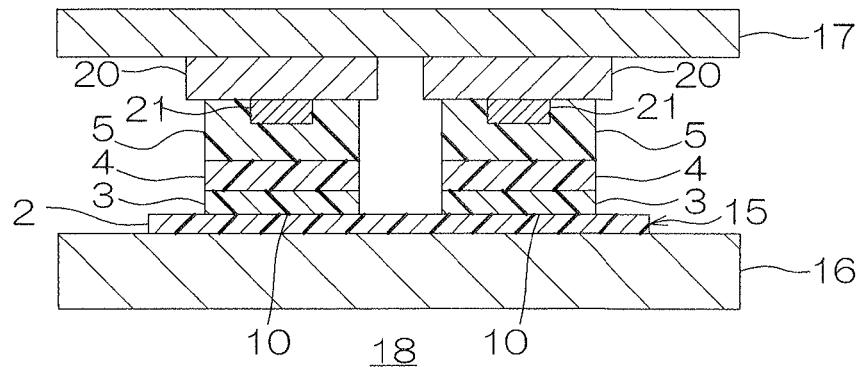
(d)
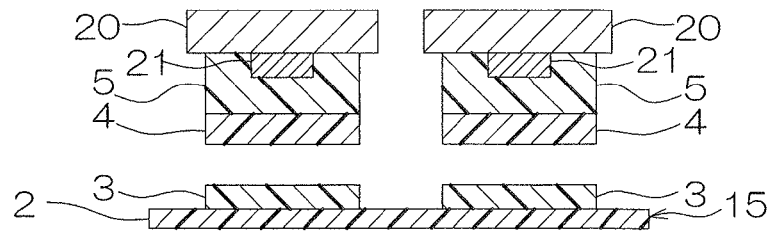

METHOD FOR PRODUCING LIGHT EMITTING DIODE DEVICE

CROSS-REFERENCE TO RELATED APPLICATION

The present application claims priority from Japanese Patent Application No. 2011-186953 filed on Aug. 30, 2011, the contents of which are hereby incorporated by reference into this application.

BACKGROUND OF THE INVENTION

1. Field of the Invention

The present invention relates to a method for producing a light emitting diode device, to be specific, to a method for producing a light emitting diode device in which a light emitting diode element is encapsulated by an encapsulating resin layer.

2. Description of Related Art

Conventionally, a light emitting diode device in which a light emitting diode element (LED) is encapsulated by an encapsulating resin layer has been known.

For example, a method for producing a light emitting diode device in which while allowing the LED mounted on a board to be disposed in opposed relation to a metal mold die having a concave portion, a resin layer is interposed therebetween and then, the metal mold die is pressed with respect to the board, so that the LED is encapsulated by the resin layer has been proposed (ref: for example, Japanese Unexamined Patent Publication No. 2010-123802).

In this method, the resin layer is formed into a shape corresponding to the concave portion in the metal mold die and can be also formed into a pattern corresponding to each of the LEDs.

SUMMARY OF THE INVENTION

However, in the method described in Japanese Unexamined Patent Publication No. 2010-123802, the concave portion in the metal mold die is required to be disposed so as to be overlapped with the LED when projected in the thickness direction. Accordingly, the metal mold die is required to be accurately positioned with respect to the LED. Then, both of the positioning of the metal mold die and the pressing by the metal mold die are required at the same time, so that the production process becomes complicated.

It is an object of the present invention to provide a method for producing a light emitting diode device in which a light emitting diode device that surely encapsulates a light emitting diode element and has excellent reliability can be easily and efficiently produced.

A method for producing a light emitting diode device of the present invention, provided with a light emitting diode element encapsulated by an encapsulating resin layer, includes the steps of preparing a laminate including a supporting layer, a constraining layer formed at one side in a thickness direction of the supporting layer, and the encapsulating resin layer formed at one side in the thickness direction of the constraining layer and made of an encapsulating resin; cutting the encapsulating resin layer and the constraining layer in the laminate into a pattern corresponding to the light emitting diode element; removing a portion which does not correspond to the light emitting diode element in the encapsulating resin layer and the constraining layer that are cut into the pattern; allowing the encapsulating resin layer corresponding to the light emitting diode element to be opposed to the light emitting diode element to be pressed in the direction where they come close to each other so as to encapsulate the light emitting diode element by the encapsulating resin layer; and removing the supporting layer and the constraining layer from the laminate.

In the method for producing a light emitting diode device of the present invention, it is preferable that the encapsulating resin is a thermosetting resin and the encapsulating resin layer is formed of a B-stage resin of the thermosetting resin.

In the method for producing a light emitting diode device of the present invention, it is preferable that in the step of preparing the laminate, a phosphor layer is interposed between the constraining layer and the encapsulating resin layer, and the encapsulating resin layer is formed at one side in the thickness direction of the phosphor layer.

In the method for producing a light emitting diode device of the present invention, the encapsulating resin layer and the constraining layer in the laminate are cut into patterns corresponding to the light emitting diode element and thereafter, the encapsulating resin layer corresponding to the light emitting diode element is opposed to the light emitting diode element to be pressed in the direction where they come close to each other, so that the light emitting diode element is encapsulated by the encapsulating resin layer.

Therefore, the above-described positioning of the metal mold die can be omitted, so that the light emitting diode element can be easily and efficiently encapsulated by the encapsulating resin layer.

In addition, in the laminate, the encapsulating resin layer is formed at one side in the thickness direction of the constraining layer, so that the encapsulating resin layer can be constrained by the constraining layer.

Therefore, the encapsulating resin layer can be cut into a pattern corresponding to the light emitting diode element with excellent accuracy, while being constrained by the constraining layer.

In addition, thereafter, a portion which does not correspond to the light emitting diode element in the encapsulating resin layer can be surely removed, while being constrained by the constraining layer.

Furthermore, the shape of the remaining encapsulating resin layer is constrained by the constraining layer, so that the maintenance of the shape can be achieved.

Furthermore, the light emitting diode element can be surely encapsulated by a portion which corresponds to the light emitting diode element in the encapsulating resin layer.

Accordingly, the light emitting diode element can be surely encapsulated by the encapsulating resin layer in which the shape thereof is maintained.

As a result, the light emitting diode device having excellent reliability can be easily and efficiently produced.

BRIEF DESCRIPTION OF THE DRAWINGS

FIG. 3 shows a step of cutting in the laminate:
  (a) illustrating a sectional view and (b) illustrating a plan view.

FIG. 6 shows a step of cutting the laminate into a pattern and cutting off the laminate per units in another embodiment of the method for producing a light emitting diode device of the present invention:
(a) illustrating a sectional view and
(b) illustrating a plan view.

FIG. 7 shows process drawings for illustrating a method for producing the light emitting diode device, subsequent to FIG. 6:
(a) illustrating a step of peeling the release layer from the laminate,
(b) illustrating a step of allowing the light emitting diode element to be opposed to the encapsulating resin layer,
(c) illustrating a step of embedding the light emitting diode element in the encapsulating resin layer, and
(d) illustrating a step of peeling the constraining layer from the laminate.

DETAILED DESCRIPTION OF THE INVENTION

Figure 1:
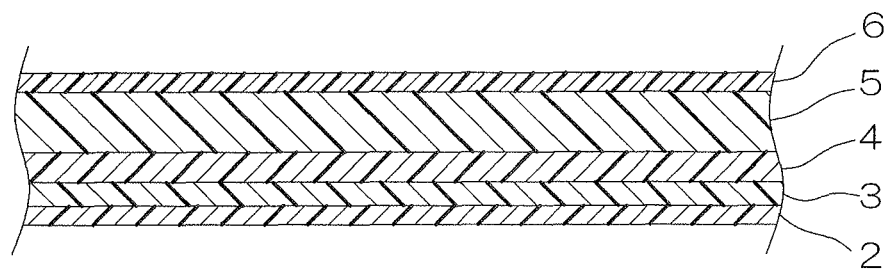
FIG. 1 shows a sectional view of a laminate prepared in one embodiment of a method for producing a light emitting diode device of the present invention.
Figure 2:
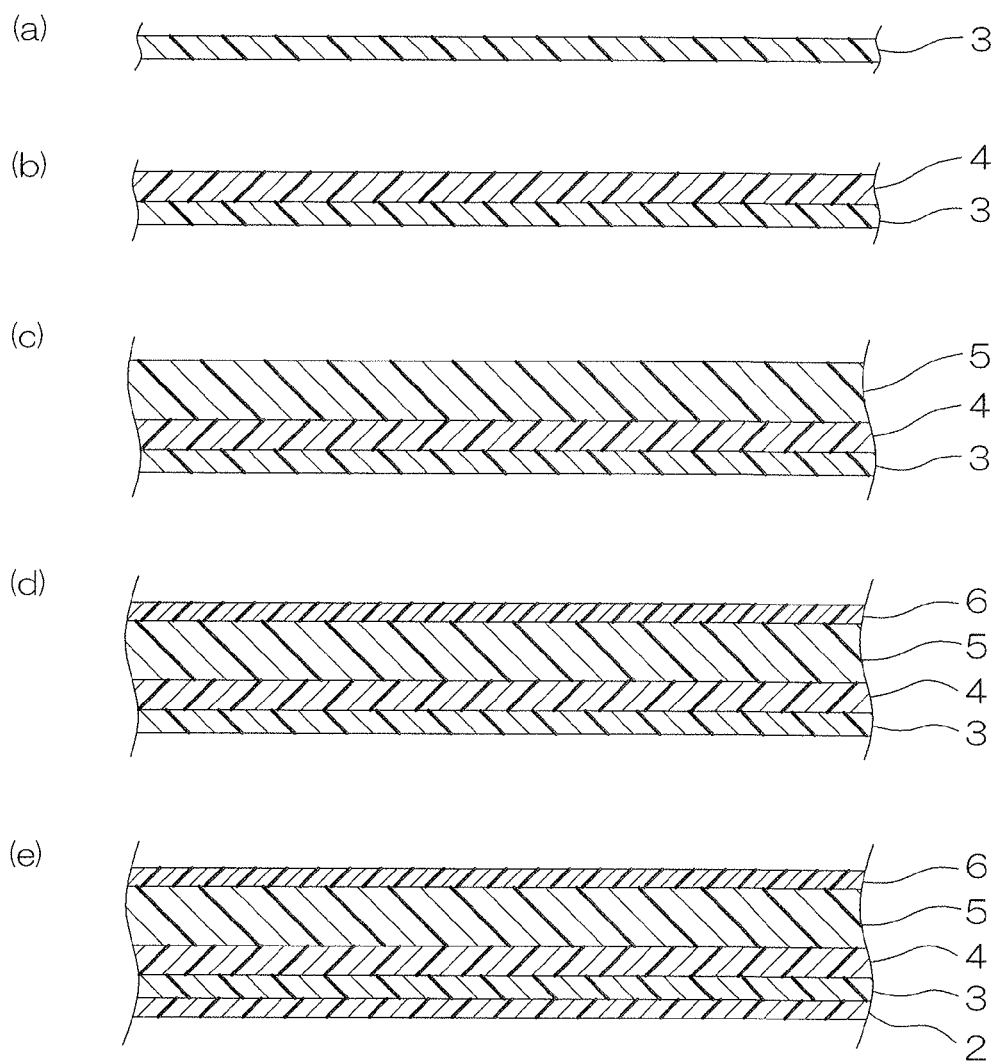
FIG. 2 shows process drawings for illustrating a method for producing the laminate shown in FIG. 1:
  (a) illustrating a step of preparing a constraining layer,
  (b) illustrating a step of forming a phosphor layer,
  (c) illustrating a step of forming an encapsulating resin layer,
  (d) illustrating a step of forming a release layer, and
  (e) illustrating a step of forming a supporting layer.
Figure 4:
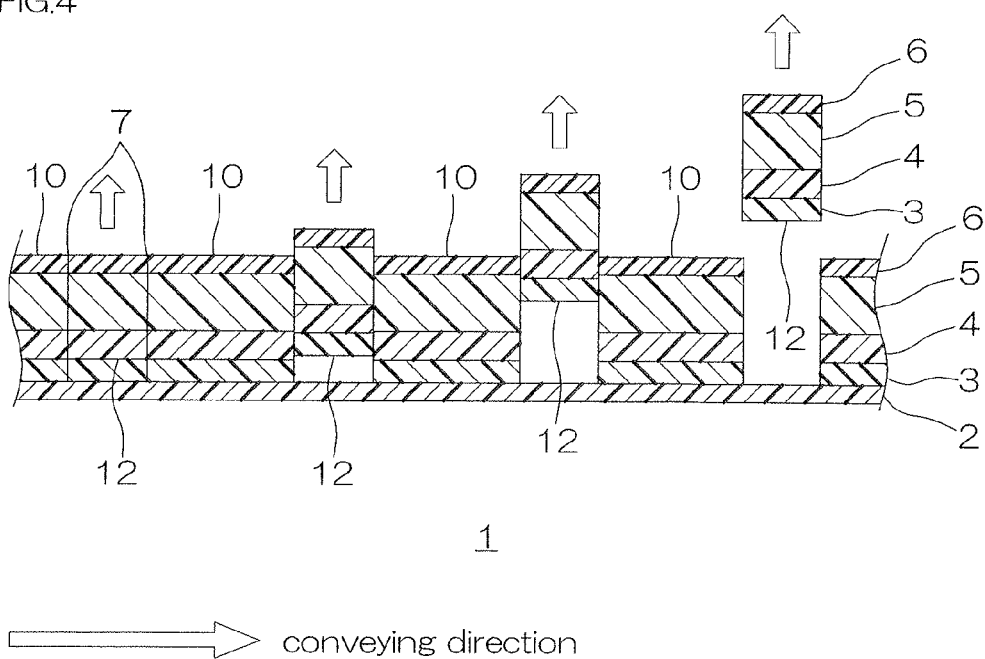
FIG. 4 shows a step of peeling the release layer, the encapsulating resin layer, the phosphor layer, and the constraining layer in an outer frame portion.
Figure 5:
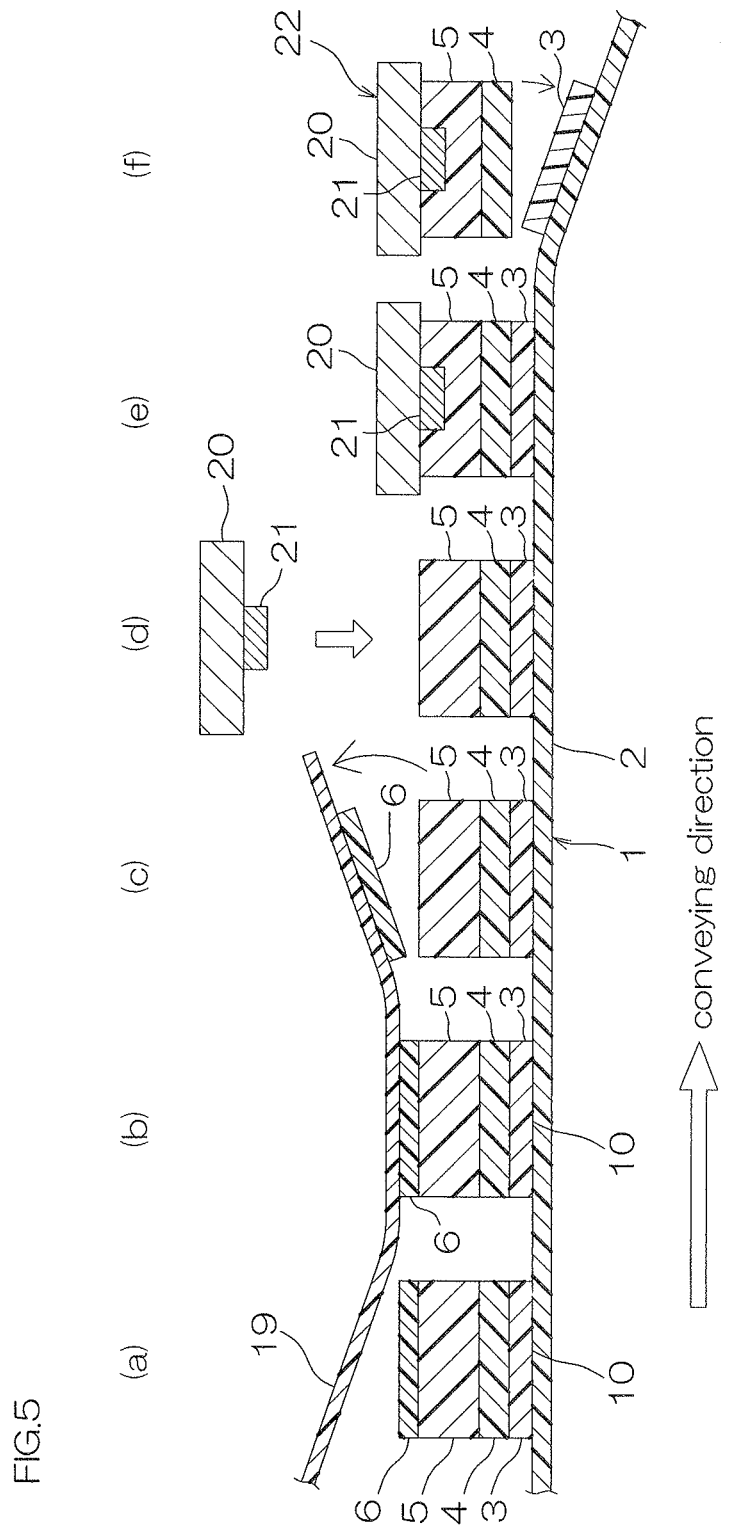
FIG. 5 shows process drawings for peeling the release layer from the laminate to encapsulate a light emitting diode element by the encapsulating resin layer:
(a) illustrating a step of disposing a pressure-sensitive adhesive film,
(b) illustrating a step of attaching the pressure-sensitive adhesive film to the release layer,
(c) illustrating a step of peeling the release layer,
(d) illustrating a step of disposing the light emitting diode element,
(e) illustrating a step of compressively bonding a mounting board to the encapsulating resin layer, and
(f) illustrating a step of peeling the constraining layer.

FIG. 1 shows a sectional view of a laminate prepared in one embodiment of a method for producing a light emitting diode device of the present invention. FIG. 2 shows process drawings for illustrating a method for producing the laminate shown in FIG. 1. FIG. 3 shows a step of cutting in the laminate. FIG. 4 shows a step of peeling the release layer, the encapsulating resin layer, the phosphor layer, and the constraining layer in an outer frame portion. FIG. 5 shows process drawings for peeling the release layer from the laminate to encapsulate a light emitting diode element by the encapsulating resin layer.

As referred in FIG. 5, this method is a method for producing a light emitting diode device 22 in which a light emitting diode element 21 is encapsulated by an encapsulating resin layer 5.

In this method, each of the steps in FIGS. 2 to 5 to be described next is performed by a roll-to-roll method in which members are processed while being continuously conveyed by a roll that is not shown. In FIGS. 2 to 5, a conveying direction of each of the members is described as a direction from the left side of the paper surface toward the right side of the paper surface for descriptive purposes.

In this method, a laminate 1 shown in FIG. 1 is first prepared.

The laminate 1 is formed into a long-length flat belt film shape along the conveying direction (ref: FIGS. 4 and 5). The laminate 1 includes a supporting layer 2, a constraining layer 3 formed on (at one side in the thickness direction of) the supporting layer 2, a phosphor layer 4 formed on (at one side in the thickness direction of) the constraining layer 3, the encapsulating resin layer 5 formed on (at one side in the thickness direction of) the phosphor layer 4, and a release layer 6 formed on the encapsulating resin layer 5.

The supporting layer 2 is formed into a flat belt film shape corresponding to the outer shape of the laminate 1. The supporting layer 2 is defined as a supporting tape (a supporting film) which supports the entire laminate 1 and is also defined as a carrier tape (a carrier film) in the roll-to-roll method.

The supporting layer 2 is formed of, for example, a resin film, a metal foil, and the like. An example of a resin material for forming the resin film includes a mild pressure-sensitive adhesive resin such as an acrylic resin, a urethane resin, and a silicone resin. Examples of a metal material for forming the metal foil include iron, copper, and stainless steel. Preferably, a resin film made of a mild pressure-sensitive adhesive resin is used.

The thickness of the supporting layer 2 is, for example, 20 to 200 μm, or preferably 50 to 90 μm.

When the supporting layer 2 is formed of a metal foil, a pressure-sensitive adhesive layer (a mild pressure-sensitive adhesive layer, a tack layer) which is not shown is laminated and a pressure-sensitive adhesive treatment (a mild pressure-sensitive adhesive treatment, a tack treatment) can be applied thereto.

The constraining layer 3 is formed into a generally same shape (in a long-length flat belt film shape) as that of the supporting layer 2. The constraining layer 3 is defined as a constraining film (a substrate film) which maintains the shapes of the phosphor layer 4 and the encapsulating resin layer 5 formed thereon.

The constraining layer 3 is formed of, for example, a resin film, a metal foil, and the like. Examples of a resin material for forming the resin film include an acrylic resin, a urethane resin, and a polyester resin (for example, polyethylene terephthalate, polyethylene naphthalate, and the like). Examples of a metal material for forming the metal foil include iron, copper, and stainless steel. Preferably, the constraining layer 3 is formed of a resin film.

The thickness of the constraining layer 3 is, for example, 12 to 250 μm, or preferably 25 to 75 μm.

A release treatment can be applied to the upper surface of the constraining layer 3.

The phosphor layer 4 is formed on the entire upper surface of the constraining layer 3.

The phosphor layer 4 is formed of, for example, a phosphor composition containing a phosphor and a resin.

An example of the phosphor includes a yellow phosphor which is capable of converting blue light into yellow light. An example of the phosphor includes a garnet-type phosphor such as $Y_3Al_5O_{12}$:Ce (YAG (yttrium aluminum garnet):Ce).

The phosphor is, for example, formed into a particle shape. The average particle size thereof is, for example, 0.1 to 30 μm, or preferably 0.2 to 10 μm.

The resin is a matrix in which the phosphor is dispersed. Examples of the resin include a thermosetting resin such as a thermosetting silicone resin, an epoxy resin, a thermosetting polyimide resin, a phenol resin, a urea resin, a melamine resin, an unsaturated polyester resin, a diallyl phthalate resin, and a thermosetting urethane resin and a thermoplastic resin such as an acrylic resin. Preferably, in view of durability, a thermosetting resin is used, or more preferably, a thermosetting silicone resin is used.

The mixing ratio of the phosphor is, for example, 5 to 50 parts by mass with respect to 100 parts by mass of the resin.

The thickness of the phosphor layer 4 is, for example, 10 to 1000 μm, or preferably 50 to 600 μm.

The encapsulating resin layer 5 is formed on the entire upper surface of the phosphor layer 4. The encapsulating resin layer 5 sandwiches the phosphor layer 4 with the constraining layer 3 in the thickness direction. That is, the phosphor layer 4 is interposed between the constraining layer 3 and the encapsulating resin layer 5.

An example of an encapsulating resin for forming the encapsulating resin layer 5 includes the same resin as that illustrated in the phosphor composition. Preferably, a thermosetting resin is used, or more preferably, a thermosetting silicone resin is used.

When the encapsulating resin is the thermosetting resin, the encapsulating resin layer 5 is formed of a B-stage resin of the thermosetting resin, so that the light emitting diode element 21 (ref: FIG. 5) can be embedded therein with a relatively small pressing force. And, by the subsequent thermal curing, the light emitting diode element 21 is encapsulated and heat resistance can be imparted to the encapsulating resin layer 5.

The above-described phosphor and a filler (silica and the like) are added to the encapsulating resin at an appropriate proportion as required, so that the encapsulating resin can be also prepared as an encapsulating resin composition.

The thickness of the encapsulating resin layer 5 is, for example, 50 to 5000 μm, or preferably 100 to 1000 μm.

The release layer 6 is laminated on the entire upper surface of the encapsulating resin layer 5.

The release layer 6 is formed into a generally same shape (in a long-length flat belt film shape) as that of the supporting layer 2. The release layer 6 is formed of, for example, a polyester resin film such as polyethylene terephthalate film and polyethylene naphthalate film and, for example, a fluorine resin film such as an ethylene-tetrafluoroethylene copolymer resin film. Preferably, the release layer 6 is formed of a polyester resin film.

A release treatment can be applied to the lower surface of the release layer 6.

The thickness of the release layer 6 is, for example, 12 to 250 μm, or preferably 25 to 75 μm.

Next, the method for producing the laminate 1 is described with reference to FIG. 2.

First, as shown in FIG. 2 (a), the constraining layer 3 is prepared.

Next, as shown in FIG. 2 (b), the phosphor layer 4 is formed on the constraining layer 3.

To form the phosphor layer 4, the above-described phosphor composition is first prepared. The phosphor composition is prepared as a liquid. To prepare the phosphor composition as a liquid, a resin in a liquid state at normal temperature is used or a known solvent is blended therein.

Next, the phosphor composition in a liquid state is applied to the entire upper surface of the constraining layer 3.

Examples of a method for applying the phosphor composition to the entire upper surface of the constraining layer 3 include a doctor blade method, a gravure coater method, and a fountain coater method.

Subsequently, the phosphor composition applied to the upper surface of the constraining layer 3 is heated at, for example, 100 to 300° C. for 5 to 30 minutes.

In this way, when the resin is the thermosetting resin, the resin is completely cured (brought into a C-stage state).

When a solvent is blended in the phosphor composition, the solvent is distilled off.

In this way, the phosphor layer 4 is formed on the constraining layer 3.

Next, as shown in FIG. 2 (c), the encapsulating resin layer 5 is formed on the phosphor layer 4.

To form the encapsulating resin layer 5, the above-described encapsulating resin is first prepared. The encapsulating resin is prepared as a liquid. To prepare the encapsulating resin as a liquid, an encapsulating resin in a liquid state at normal temperature is used or a known solvent is blended therein.

Next, the encapsulating resin in a liquid state is applied to the entire upper surface of the phosphor layer 4.

Examples of a method for applying the encapsulating resin to the entire upper surface of the phosphor layer 4 include a doctor blade method, a gravure coater method, and a fountain coater method.

Subsequently, the encapsulating resin applied to the upper surface of the phosphor layer 4 is heated at, for example, 40 to 150° C. for 1 to 60 minutes.

In this way, when the encapsulating resin is the thermosetting resin, the encapsulating resin is semi-cured (brought into a B-stage state). When a solvent is blended in the encapsulating resin, the solvent is distilled off.

In this way, the encapsulating resin layer 5 made of the B-stage resin is formed on the phosphor layer 4.

Next, as shown in FIG. 2 (d), the release layer 6 is formed on the encapsulating resin layer 5.

To be specific, the release layer 6 is attached to the entire upper surface of the encapsulating resin layer 5. In this way, the encapsulating resin layer 5 is protected by the release layer 6.

Thereafter, as shown in FIG. 2 (e), the supporting layer 2 is formed below the constraining layer 3.

To be specific, the supporting layer 2 is attached to the lower surface of the constraining layer 3.

In this way, the laminate 1 shown in FIG. 1 is obtained.

Next, in this method, as shown in FIGS. 3 (a) and 3 (b), the constraining layer 3, the phosphor layer 4, the encapsulating resin layer 5, and the release layer 6 in the laminate 1 are cut into patterns (patterns of defining embedded areas (portions) of the light emitting diode elements 21) corresponding to the light emitting diode elements 21 (ref: FIG. 5) (cut-out portions 7 are formed).

To be specific, in the constraining layer 3, the phosphor layer 4, the encapsulating resin layer 5, and the release layer 6, a plurality of the cut-out portions 7 (dashed lines in FIG. 3 (a)) in generally circular ring shapes in plane view are formed at spaced intervals to each other along the long-length direction from the upper side toward the lower side by using a blade die in a generally circular ring shape.

The cut-out portions 7 are formed in the thickness direction so that the supporting layer 2 is not cut off and each of the layers on the supporting layer 2, that is, the constraining layer 3, the phosphor layer 4, the encapsulating resin layer 5, and the release layer 6 are cut off.

In this way, in plane view, the cut-out portions 7 are formed in the laminate 1 so as to divide embedded portions 10 as portions which correspond to the light emitting diode elements 21 at the inside of the cut-out portions 7 from the outer frame portion 12 as a portion which does not correspond to the light emitting diode elements 21 at the outside of the cut-out portions 7.

The outer frame portion 12 is formed into a pattern of continuing in the long-length direction at both end portions in the widthwise direction (the direction perpendicular to the thickness and long-length directions) of the laminate 1 and being disposed between the embedded portions 10 to connect both end portions in the widthwise direction.

The diameter (the maximum length) of the embedded portion 10 is, for example, 5 to 300 mm, or preferably 7 to 200 mm. The space (the space in the long-length direction) between the embedded portions 10 is, for example, 20 to 1000 mm, or preferably 50 to 200 mm.

Next, in this method, as shown in FIG. 4, the portions which do not correspond to the light emitting diode elements 21 (ref: FIG. 5) in the constraining layer 3, the phosphor layer 4, the encapsulating resin layer 5, and the release layer 6 are removed.

That is, the constraining layer 3 in the outer frame portion 12 is peeled from the supporting layer 2. To be specific, the constraining layer 3, the phosphor layer 4, the encapsulating resin layer 5, and the release layer 6 in the outer frame portion 12 are lifted upwardly.

In this way, in the embedded portions 10, the constraining layers 3, the phosphor layers 4, the encapsulating resin layers 5, and the release layers 6, which are laminated on the supporting layer 2, are formed into patterns corresponding to the cut-out portions 7.

Next, in this method, as shown in FIGS. 5 (*a*) to 5 (*c*), the release layer 6 in each of the embedded portions 10 is peeled from the encapsulating resin layer 5.

To peel the release layer 6 in each of the embedded portions 10 from the encapsulating resin layer 5, for example, as shown in FIG. 5 (*a*), a pressure-sensitive adhesive film 19 is first disposed on the encapsulating resin layer 5 in opposed relation thereto.

The pressure-sensitive adhesive film 19 is, for example, formed into a generally same shape (in a long-length flat belt film shape) as that of the supporting layer 2. The pressure-sensitive adhesive film 19 is formed of, for example, a known pressure-sensitive adhesive such as an acrylic pressure-sensitive adhesive. The thickness of the pressure-sensitive adhesive film 19 is, for example, 30 to 300 μm.

Next, as shown in FIG. 5 (*b*), the pressure-sensitive adhesive film 19 is attached to the upper surface of the release layer 6. In this way, the release layer 6 is attached to the lower surface of the pressure-sensitive adhesive film 19.

Thereafter, as shown by an arrow in FIG. 5 (*c*), the release layer 6 is peeled from the encapsulating resin layer 5 by lifting the pressure-sensitive adhesive film 19 upwardly.

Next, in this method, as shown in FIG. 5 (*d*), the encapsulating resin layer 5 corresponding to the light emitting diode element 21 is opposed to the light emitting diode element 21.

To be specific, the light emitting diode element 21 is disposed on the encapsulating resin layer 5 in the embedded portion 10 in opposed relation thereto.

At this time, the light emitting diode element 21 is positioned with respect to the encapsulating resin layer 5. The positioning of the light emitting diode element 21 with respect to the encapsulating resin layer 5 is performed after suspending continuous conveying in the roll-to-roll method.

The light emitting diode element 21 is mounted on a mounting board 20. To be specific, the light emitting diode element 21 is mounted on the lower surface of the mounting board 20 by a wire bonding, a flip-chip bonding, or the like. To be more specific, the light emitting diode element 21 is provided so as to be included in the mounting board 20 when projected in the thickness direction and to be specific, is provided in the central portion on the lower surface of the mounting board 20.

In FIG. 5 (*d*), the mounting board 20 is supported by a pick-up device (a suction device), which is not shown, or the like.

Next, in this method, as shown by the arrow in FIG. 5 (*d*), and FIG. 5 (*e*), the light emitting diode element 21 and the encapsulating resin layer 5 are pressed in the direction where they come close to each other.

To be specific, the mounting board 20 is pressed downwardly, so that the mounting board 20 is compressively bonded to the encapsulating resin layer 5.

The pressing force of the mounting board 20 with respect to the encapsulating resin layer 5 is, for example, 0.01 to 10 MPa, or preferably 0.1 to 4 MPa.

In this way, the light emitting diode element 21 is press-fitted into the encapsulating resin layer 5 to be embedded therein.

In this way, the light emitting diode element 21 can be encapsulated by the encapsulating resin layer 5.

Next, in this method, as shown by the arrow in FIG. 5 (*f*), the supporting layer 2 and the constraining layer 3 are removed from the laminate 1.

To be specific, the supporting layer 2 and the constraining layer 3 are lowered downwardly with respect to the encapsulating resin layer 5 and the constraining layer 3 is peeled from the encapsulating resin layer 5.

In the lowering of the supporting layer 2 and the constraining layer 3, they are in close contact with each other without being peeled off due to the adhesion of the supporting layer 2.

In the lowering of the supporting layer 2 and the constraining layer 3, the suspended continuous conveying in the roll-to-roll method is resumed.

Thereafter, when the encapsulating resin is the thermosetting resin, the encapsulating resin of the encapsulating resin layer 5 is heated at, for example, 150 to 300° C. for 5 to 300 minutes to be completely cured (brought into a C-stage state).

In this way, the light emitting diode device 22 including the mounting board 20, the light emitting diode element 21, the encapsulating resin layer 5, and the phosphor layer 4 is obtained.

The light emitting diode device 22 is supported by a pick-up device (a suction device), which is not shown, or the like.

In this method, the release layer 6, the encapsulating resin layer 5, the phosphor layer 4, and the constraining layer 3 in the laminate 1 are cut into patterns corresponding to the light emitting diode elements 21 and thereafter, the encapsulating resin layers 5 in the embedded portions 10 are opposed to the light emitting diode elements 21 to be pressed in the direction where they come close to each other, so that the light emitting diode elements 21 are encapsulated by the encapsulating resin layers 5.

Therefore, the positioning of the metal mold die described in Japanese Unexamined Patent Publication No. 2010-123802 can be omitted, so that the light emitting diode elements 21 can be easily and efficiently encapsulated by the encapsulating resin layer 5.

In addition, in the laminate 1, the encapsulating resin layer 5 and the phosphor layer 4 are formed on the constraining layer 3, so that the encapsulating resin layer 5 and the phosphor layer 4 can be constrained by the constraining layer 3.

Therefore, the encapsulating resin layer 5 and the phosphor layer 4 can be cut into patterns corresponding to the light emitting diode elements 21 with excellent accuracy, while being constrained by the constraining layer 3.

In addition, thereafter, the release layer 6, the encapsulating resin layer 5, and the phosphor layer 4 in the outer frame portion 12 can be surely removed, while being constrained by the constraining layer 3.

Furthermore, the shapes of the encapsulating resin layers 5 and the phosphor layers 4 in the remaining embedded portions 10 are constrained by the constraining layers 3, so that the maintenance of the shapes can be achieved.

Furthermore, the light emitting diode elements 21 can be surely encapsulated by the encapsulating resin layers 5 in the embedded portions 10.

Accordingly, the light emitting diode elements 21 can be surely encapsulated by the encapsulating resin layers 5 in which the shapes thereof are maintained.

As a result, the light emitting diode device 22 having excellent reliability can be easily and efficiently produced.

In the embodiments in FIGS. 1 and 2, the phosphor layer 4 is provided in the laminate 1. Alternatively, for example, though not shown, the phosphor layer 4 is not provided in the laminate 1 and after encapsulating the light emitting diode elements 21 by the encapsulating resin layer 5, separately, the phosphor layer 4 can be laminated on (attached to) the lower surface of the encapsulating resin layer 5.

Preferably, the phosphor layer 4 is provided in the laminate 1 in advance. In this method, the step of separately providing the phosphor layer 4 in the encapsulating resin layer 5 after encapsulating the light emitting diode elements 21 can be omitted.

Therefore, the light emitting diode device 22 can be further easily produced.

In addition, in the embodiments in FIG. 5, the supporting layer 2 is disposed at the lower side in the laminate 1 and the mounting board 20 is disposed at the upper side in the light emitting diode device 22. However, the arrangement thereof in the up-down direction is not particularly limited. Alternatively, for example, though not shown, they can be adversely laminated. That is, the supporting layer 2 can be disposed at the upper side in the laminate 1 and the mounting board 20 can be disposed at the lower side in the light emitting diode device 22.

Figure 8:
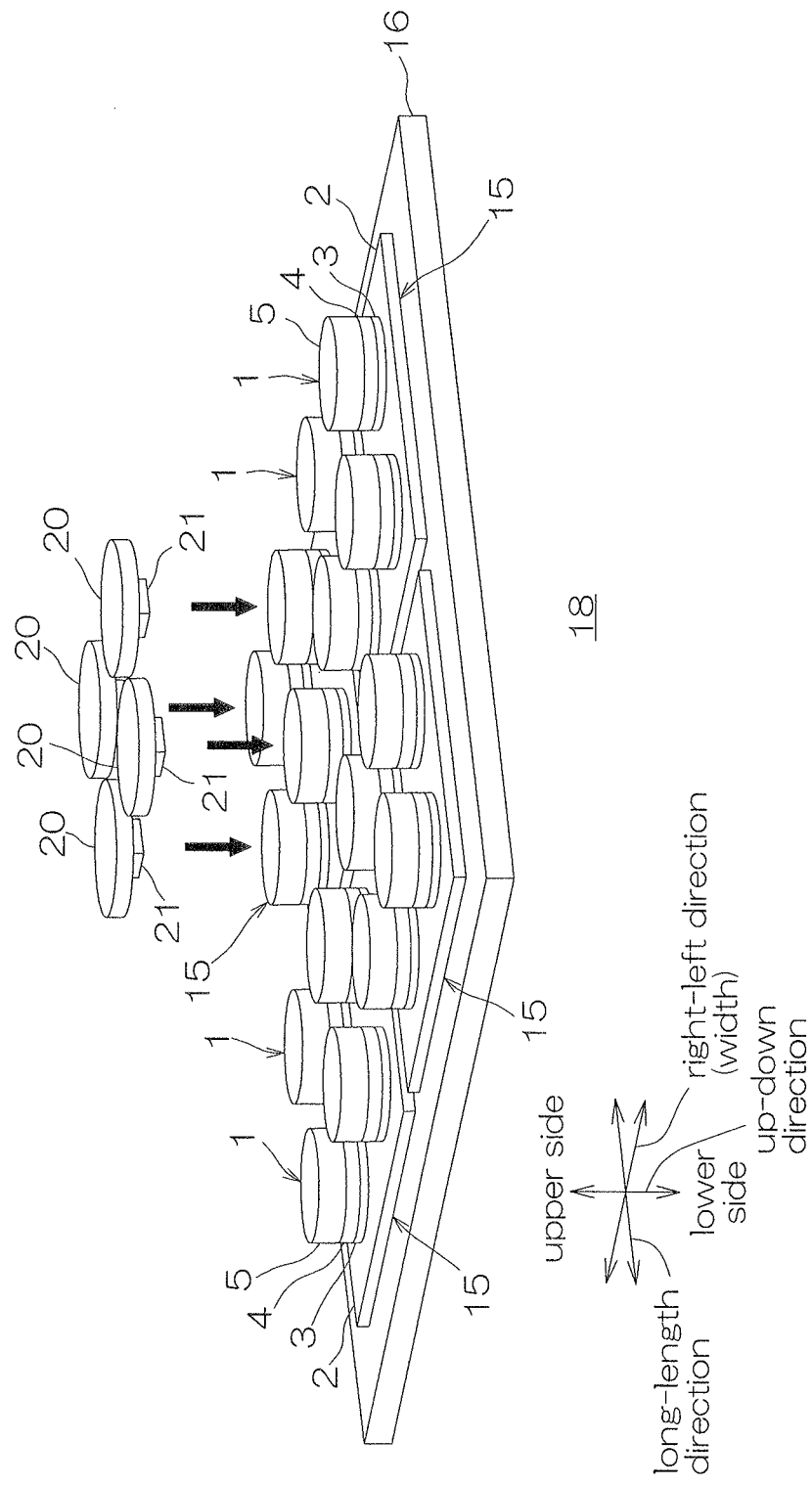
FIG. 8 shows a perspective view for illustrating a step of disposing a plurality of the units on the upper surface of a stage in alignment in the step shown in FIG. 7 (b).
Figure 9:
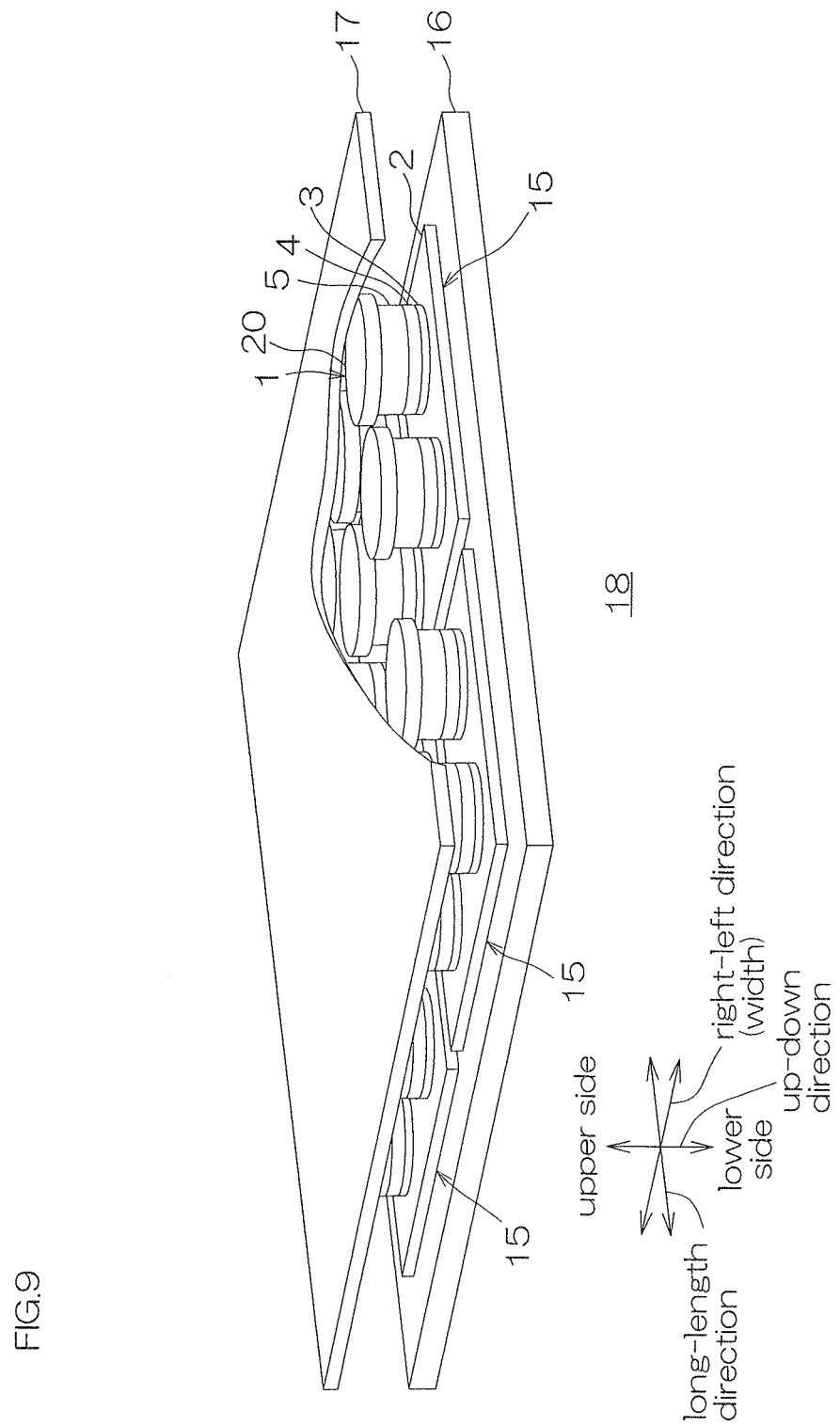
FIG. 9 shows a partially cut-out perspective view for illustrating a step of pressing a unit assembly in the step shown in FIG. 7 (c).

FIG. 6 shows a step of cutting the laminate into a pattern and cutting off the laminate per units in another embodiment of the method for producing a light emitting diode device of the present invention. FIG. 7 shows process drawings for illustrating a method for producing the light emitting diode device, subsequent to FIG. 6. FIG. 8 shows a perspective view for illustrating a step of disposing a plurality of the units on the upper surface of a stage in alignment in the step shown in FIG. 7 (b). FIG. 9 shows a partially cut-out perspective view for illustrating a step of pressing a unit assembly in the step shown in FIG. 7 (c).

In each figure to be described below, the same reference numerals are provided for members corresponding to each of those described above, and their detailed description is omitted.

In the embodiment in FIG. 3 (b), the embedded portions 10 are provided in one row in the widthwise direction. Alternatively, for example, the embedded portions 10 can be provided in a plurality of rows in the widthwise direction. To be specific, as shown in FIG. 6 (b), the embedded portions 10 can be provided in two rows in the widthwise direction.

In the embodiment in FIG. 5 (e), one piece of the light emitting diode element 21 is embedded in the encapsulating resin layer 5 in one piece of the embedded portion 10. Alternatively, for example, though not shown, a plurality of the light emitting diode elements 21 can be embedded in the encapsulating resin layer 5 in one piece of the embedded portion 10. In addition, in that case, each of the plurality of the light emitting diode elements 21 can be mounted on each of the mounting boards 20, respectively. Alternatively, a plurality of the light emitting diode elements 21 can be collectively mounted on one piece of the mounting board 20 (the large mounting board 20, to be specific, a wafer or the like).

In the embodiments in FIG. 5, the steps are performed by the roll-to-roll method. Alternatively, for example, as shown in FIGS. 7 to 9, the steps can be performed by a single wafer method (a batch method).

Next, the method for producing the light emitting diode device 22 in which the steps excluding the steps of preparing the laminate 1 (FIG. 2) and cutting in the laminate 1 (FIG. 6) are performed by the single wafer method is described with reference to FIGS. 7 to 9.

In this method, as shown in FIGS. 1 and 2, the laminate 1 in a long-length flat belt shape is first prepared.

Next, in this method, as shown in FIG. 6, the constraining layer 3, the phosphor layer 4, the encapsulating resin layer 5, the release layer 6 in the laminate 1 are cut in and the laminate 1 is cut off per units 15, each of which includes a plurality of the embedded portions 10.

To be specific, the cut-out portions 7 are formed in alignment in the widthwise and long-length directions of the laminate 1, so that the embedded portions 10 disposed in alignment in the widthwise and long-length directions are formed.

The laminate 1 is cut off into the units 15, each of which includes a plurality of the embedded portions 10 disposed in alignment in two rows in the widthwise direction and in two rows in the long-length direction, in generally rectangular shapes in plane view. That is, the supporting layer 2, the constraining layer 3, the phosphor layer 4, the encapsulating resin layer 5, and the release layer 6 are cut off so as to correspond to the units 15.

The size of the unit 15 is appropriately selected. The length in the long-length direction thereof is, for example, 100 to 1000 mm and the length in the widthwise direction thereof is 100 to 1000 mm. The space in the long-length direction and the space in the widthwise direction between the embedded portions 10 are, for example, 20 to 500 mm, or preferably 50 to 200 mm.

Next, as shown in FIG. 7 (a), the release layers 6 in the embedded portions 10 in each of the units 15 are peeled off. To be specific, the pressure-sensitive adhesive film 19 is attached to the upper surfaces of the release layers 6 and subsequently, the pressure-sensitive adhesive film 19 is lifted upwardly.

Thereafter, as shown in FIG. 8, the units 15 in which the release layers 6 are peeled off are put on a stage 16. To be specific, the units 15 are put on the upper surface of the stage 16 so that each of the units 15 is disposed in alignment at spaced intervals to each other in the widthwise and long-length directions. The space between the units 15 is, for example, 10 to 100 mm.

The stage 16 is formed into a generally rectangular plate shape and is formed of, for example, a metal plate such as an iron plate, a stainless plate, and the like.

In this way, a unit assembly 18 in which a plurality of the units 15 are put on the stage 16 is fabricated.

Next, as shown in FIGS. 7 (b) and 8, the light emitting diode elements 21 are disposed in opposed relation to the encapsulating resin layers 5 in the unit assembly 18.

Thereafter, as shown in FIG. 7 (c), the light emitting diode elements 21 and the encapsulating resin layers 5 are pressed in the direction where they come close to each other, so that the light emitting diode elements 21 are embedded in the encapsulating resin layers 5.

To be specific, a hot plate 17 is disposed on the upper surfaces of the mounting boards 20 and the hot plate 17 presses the mounting boards 20. That is, the light emitting diode elements 21 and the encapsulating resin layers 5 are pressed in the thickness direction by being sandwiched between the hot plate 17 and the stage 16 in the thickness direction.

The temperature of the hot plate 17 is, for example, 120 to 200° C., or preferably 140 to 165° C. The hot plate 17 is formed into a generally rectangular plate shape having a size slightly larger than that of the unit assembly 18.

Next, the hot plate 17 is lifted up and each of the units 15 is taken down from the stage 16. Subsequently, as shown in FIG. 7 (d), the supporting layer 2 and the constraining layers 3 are removed from the laminate 1. To be specific, the constraining layers 3 are peeled from the encapsulating resin layers 5.

Thereafter, when the encapsulating resin is the thermosetting resin, the encapsulating resin layer 5 is heated at, for example, 150 to 300° C. for 5 to 300 minutes to be completely cured (brought into a C-stage state).

In this way, the light emitting diode device 22 is obtained.

The embodiments in FIG. 7 have the same function and effect as those of the embodiments in FIGS. 3 to 5. In addition, the single wafer method is used therein. Therefore, the production cost can be reduced in the case of low-volume production in accordance with the type, size, or the like of the light emitting diode element 21 and the light emitting diode device 22.

EXAMPLES

While the present invention will be described hereinafter in further detail with reference to Examples, the present invention is not limited to these Examples.

Example 1

Roll-to-Roll Method

The following steps were performed by a roll-to-roll method.

(Production of Laminate)

A constraining layer having the upper surface subjected to a release treatment and made of polyethylene terephthalate was prepared (ref: FIG. 2 (a)). The constraining layer was formed into a long-length flat belt shape and had a width of 300 mm and a thickness of 50 µm.

Next, a phosphor layer was formed on the constraining layer (ref: FIG. 2 (b)).

To be specific, first, a phosphor composition in a liquid state containing 100 parts by mass of a thermosetting silicone resin in a liquid state at normal temperature and 26 parts by mass of a phosphor (in a particle shape, an average particle size: 10 µm, a YAG particle) was prepared. Subsequently, the prepared phosphor composition was applied to the entire upper surface of the constraining layer by a doctor blade method to be then heated at 100° C. for 5 minutes, so that the phosphor layer in a completely cured state (in a C-stage state) having a thickness of 100 µm was formed.

Next, an encapsulating resin layer was formed on the phosphor layer (ref: FIG. 2 (c)).

To be specific, first, a thermosetting silicone resin in a liquid state at normal temperature was applied to the entire upper surface of the phosphor layer by the doctor blade method to be then heated at 120° C. for 10 minutes, so that the encapsulating resin layer in a semi-cured state (in a B-stage state) having a thickness of 900 µm was formed.

Next, a release layer having the lower surface subjected to a release treatment, made of polyethylene terephthalate, and having a thickness of 50 µm was attached to the entire upper surface of the encapsulating resin layer (ref: FIG. 2 (d)). The release layer was formed into a long-length flat belt shape having the same size as that of the constraining layer.

Thereafter, a supporting layer made of an acrylic resin (a mild pressure-sensitive adhesive) and having a thickness of 70 µm was attached to the entire lower surface of the constraining layer (ref: FIG. 2 (e)).

In this way, a laminate was produced (ref: FIG. 1).

(Production of Light Emitting Diode Device)

The constraining layer, the phosphor layer, the encapsulating resin layer, and the release layer in the laminate were cut into patterns corresponding to light emitting diode elements (ref: FIG. 5) to form cut-out portions in circular ring shapes by using a blade die in a circular ring shape (ref: FIGS. 3 (a) and 3 (b)). The diameter of the cut-out portion was 100 mm and the space between the cut-out portions was 50 mm.

Next, the constraining layer, the phosphor layer, the encapsulating resin layer, and the release layer in an outer frame portion divided at the outside of the cut-out portions were removed from the supporting layer (ref: FIG. 4).

Next, a pressure-sensitive adhesive film made of an acrylic pressure-sensitive adhesive and having a thickness of 70 µm was disposed on each of the encapsulating resin layers in opposed relation thereto (ref: FIG. 5 (a)). Subsequently, the pressure-sensitive adhesive film was attached to the upper surface of each of the release layers (ref: FIG. 5 (b)) and then, the release layer was peeled from the encapsulating resin layer by lifting the pressure-sensitive adhesive film upwardly (ref: an arrow in FIG. 5 (c)).

Next, the encapsulating resin layer in each of the embedded portions was opposed to the light emitting diode element mounted on the lower surface of the mounting board, so that light emitting diode element was positioned with respect to the encapsulating resin layer (ref: FIG. 5 (d)).

Next, the mounting board was pressed downwardly, so that the mounting board was compressively bonded to the encapsulating resin layer at a pressure of 2.77 MPa. In this way, the light emitting diode element was press-fitted into the encapsulating resin layer to be embedded in the encapsulating resin layer (ref: the arrow in FIG. 5 (d), and FIG. 5 (e)).

In this way, the light emitting diode element was encapsulated by the encapsulating resin layer.

Thereafter, the supporting layer and the constraining layer were lowered downwardly with respect to the encapsulating resin layer and the constraining layer was peeled from the encapsulating resin layer (ref: the arrow in FIG. 5 (f)).

Thereafter, the encapsulating resin layer was heated at 150° C. for 120 minutes to be completely cured (brought into a C-stage state).

In this way, a light emitting diode device was obtained.

Example 2

Roll-to-Roll Method and Single Wafer Method

The step of preparing the laminate (ref: FIG. 2) and the step of cutting in the laminate (ref: FIG. 6) were performed by a roll-to-roll method and the steps other than the above-described steps were performed by a single wafer method.

That is, a laminate was produced in the same manner as in Example 1 (ref: FIGS. 1 and 2).

Subsequently, the constraining layer, the phosphor layer, the encapsulating resin layer, and the release layer in the laminate were cut in and the laminate was cut off per units, each of which included four pieces of the embedded portions (ref: FIG. 6 (b)).

The size of the unit was 300×300 mm. The diameter of the embedded portion was 100 mm. The space between the embedded portions was 50 mm.

Next, the pressure-sensitive adhesive film made of an acrylic pressure-sensitive adhesive and having a thickness of 70 μm was attached to the upper surfaces of the release layers. Subsequently, the release layers in the embedded portions were peeled off by lifting the pressure-sensitive adhesive film upwardly (ref: FIG. 7 (a)).

Thereafter, the units were put on the upper surface of a stage so that each of the units was disposed in alignment at spaced intervals to each other in the widthwise and long-length directions (ref: FIG. 8). The space between the units was 20 mm.

The light emitting diode elements were disposed in opposed relation to the encapsulating resin layers in the embedded portions (ref: FIGS. 7 (b) and 8).

Next, a hot plate at 160° C. was disposed on the upper surfaces of mounting boards to press the mounting boards (ref: FIGS. 7 (c) and 9).

Thereafter, the hot plate was lifted up and each of the units was taken down from the stage and the supporting layer and the constraining layers were removed from the laminate.

Thereafter, the encapsulating resin layer was heated at 150° C. for 120 minutes to be completely cured (brought into a C-stage state).

In this way, a light emitting diode device was obtained (ref: FIG. 7 (d)).

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a light emitting diode device, provided with a light emitting diode element encapsulated by an encapsulating resin layer, comprising, in order, the steps of:
preparing a laminate including a supporting layer, a constraining layer formed at one side in a thickness direction of the supporting layer, and the encapsulating resin layer formed at one side in the thickness direction of the constraining layer and made of an encapsulating resin;
cutting the encapsulating resin layer and the constraining layer in the laminate into a pattern corresponding to the light emitting diode element;
removing a portion which does not correspond to the light emitting diode element in the encapsulating resin layer and the constraining layer that are cut into the pattern;
allowing the encapsulating resin layer corresponding to the light emitting diode element to be opposed to the light emitting diode element to be pressed in the direction where they come close to each other so as to encapsulate the light emitting diode element by the encapsulating resin layer; and
removing the supporting layer and the constraining layer from the laminate.

2. The method for producing a light emitting diode device according to claim 1, wherein
the encapsulating resin is a thermosetting resin and
the encapsulating resin layer is formed of a B-stage resin of the thermosetting resin.

3. The method for producing a light emitting diode device according to claim 1, wherein
in the step of preparing the laminate,
a phosphor layer is interposed between the constraining layer and the encapsulating resin layer, and
the encapsulating resin layer is formed at one side in the thickness direction of the phosphor layer.

* * * * *